United States Patent
Nakajima

(10) Patent No.: US 6,909,756 B1
(45) Date of Patent: Jun. 21, 2005

(54) TRANSMITTER AND DISTORTION COMPENSATION METHOD TO BE USED THEREFOR

(75) Inventor: Toshikazu Nakajima, Tokyo (JP)

(73) Assignee: NEC Corporation, Tokyo (JP)

( * ) Notice: Subject to any disclaimer, the term of this patent is extended or adjusted under 35 U.S.C. 154(b) by 706 days.

(21) Appl. No.: 09/686,760

(22) Filed: Oct. 12, 2000

(30) Foreign Application Priority Data

Oct. 13, 1999 (JP) ............................................. 11/290380

(51) Int. Cl.$^7$ ........................... H04L 25/03; H03L 5/00; H03F 1/26
(52) U.S. Cl. ........................ 375/296; 375/297; 327/317; 330/149
(58) Field of Search ................................. 375/295, 296, 375/254, 144, 284, 285, 297; 330/149; 455/126, 114.2, 114.3, 501, 570, 127.1, 127.3, 127.5; 332/107, 123, 159–162, 124; 340/310.01, 310.02, 310.03; 381/94.1; 327/312, 317

(56) References Cited

U.S. PATENT DOCUMENTS

| 5,404,378 A | 4/1995 | Kimura |
| 5,524,285 A | 6/1996 | Wray et al. |
| 5,867,065 A * | 2/1999 | Leyendecker ................ 330/149 |
| 5,898,338 A * | 4/1999 | Proctor et al. ............... 330/149 |
| 5,903,823 A * | 5/1999 | Moriyama et al. ........... 455/126 |
| 6,141,390 A * | 10/2000 | Cova ........................... 375/297 |
| 6,275,103 B1 * | 8/2001 | Maniwa ...................... 330/149 |
| 6,373,902 B1 * | 4/2002 | Park et al. ................... 375/296 |
| 6,400,774 B1 * | 6/2002 | Matsuoka et al. ........... 375/295 |

FOREIGN PATENT DOCUMENTS

| GB | 2 337 169 A | 11/1999 |
| JP | 8-37427 A | 2/1996 |
| JP | 9-153849 A | 6/1997 |
| WO | WO 98/12800 A1 | 3/1998 |
| WO | WO 98/51005 A1 | 11/1998 |
| WO | WO 99/17440 A1 | 4/1999 |

* cited by examiner

Primary Examiner—Temesghen Ghebretinsae
Assistant Examiner—Sam K. Ahn
(74) Attorney, Agent, or Firm—Sughrue Mion, PLLC

(57) ABSTRACT

A transmitter is capable of avoiding increasing of a circuit size and current consumption. The transmitter assembly includes a pre-distortion type linearizer correcting to mutually cancel a distortion component caused in a transmission signal and a correction data component. The transmitter assembly also includes first storage means for preliminarily storing the correction data.

20 Claims, 5 Drawing Sheets

FIG.2

| (V1 + v2) LEVEL | ADDRESS |
|---|---|
| < A0 | 0 |
| A0 ≦ V < A1 | 1 |
| A1 ≦ V < A2 | 2 |
| A2 ≦ V < A3 | 3 |
| ⋮ | ⋮ |

FIG.3

COMPENSATION DATA TABLE #1

| ADDRESS | DATA | |
|---|---|---|
| 0 | $-\Delta G10$ | $-\Delta \theta 10$ |
| 1 | $-\Delta G11$ | $-\Delta \theta 11$ |
| 2 | $-\Delta G12$ | $-\Delta \theta 12$ |
| 3 | $-\Delta G13$ | $-\Delta \theta 13$ |
| ⋮ | ⋮ | ⋮ |

| TEMPERATURE t/FREQUENCY f | f0 | f1 | f2 | . . . . |
|---|---|---|---|---|
| < t0 | TABLE #0 | . . . . | . . . . | . . . . |
| t0 ≤ t < t1 | TABLE #1 | . . . . | . . . . | . . . . |
| t1 ≤ t < t2 | TABLE #2 | . . . . | . . . . | . . . . |
| t2 ≤ t < t3 | TABLE #3 | . . . . | . . . . | . . . . |
| ⋮ | ⋮ | ⋮ | ⋮ | ⋮ |

GAIN AND PHASE CHARACTERISTICS OF TRANSMITTER 3 ALONE

TRANSMITTER AND DISTORTION COMPENSATION METHOD TO BE USED THEREFOR

BACKGROUND OF THE INVENTION

1. Field of the Invention

The present invention relates to a transmitter and a distortion compensation method to be used therefor. More particularly, the invention relates to a distortion compensating method in a transmitter having a pre-distortion type linearizer.

2. Description of the Related Art

Conventionally, the transmitter of this type is constructed with a transmission signal generating portion 21, a pre-distortion type linearizer 22, a transmitter 23, a directional coupler 24, an antenna 25, a power calculator 26, a compensation value calculating means 27 and a demodulation means 28, as shown in FIG. 7.

Here, since a transmission signal is distorted due to non-linear characteristics or an amplifier or the like, in case of the transmitter 23 alone, the pre-distortion type linearizer 22 is provided between an output of the signal generating portion 21 and an input of the transmitter 23.

The pre-distortion type linearizer 22 performs correction for mutually canceling distortion component and correction data component generated in the transmitter 23. By this, distortion of an output waveform of the transmitter 23 can be improved. The directional coupler 24 divides an RF signal. Host of the power thereof becomes an output of the antenna 25. However, a part of the power is input to the demodulating means 28. The power calculator 26 calculates an instantaneous power of a base band signal.

As a generation method of the compensation data input to the pre-distortion type linearizer 22, there is a method to return a part of the output of the transmitter 23 to the base band signal by the demodulator 28 and to arithmetically derive the distortion component from this signal and the result of the power calculator 26 by the compensation value calculating means.

In the distortion compensation method in the conventional transmitter set forth above, since the distortion component is arithmetically derived by returning a part of the transmitter to the base band signal by the demodulation means and calculating the distortion component from this signal and the result of the power calculator by the compensation value calculating means, a scale of the circuit becomes large to also increase current consumption.

SUMMARY OF THE INVENTION

The present invention has been worked out in view of the problem in the prior art set forth above, It is therefore an object of the present invention to provide a distortion compensation circuit of a transmitter which can avoid increasing of a circuit size and current consumption.

According to the first aspect of the present invention, a transmitter assembly including a pre-distortion type linearizer correcting to mutually cancel a distortion component caused in a transmission signal and a correction data component, comprises:

first storage means for preliminarily storing the correction data.

According to the second aspect of the present invention, a distortion compensation method for a transmitter including a pre-distortion type linearizer correcting to mutually cancel a distortion component caused in a transmission signal and a correction data component, comprises steps of:

reading out a value corresponding to a transmission level from a first storage means preliminarily storing the correction data; and inputting the read out value to the pre-distortion type linearizer.

The first storage means may manage correction data as table per transmission level. The transmitter assembly may further comprise second storage means having a plurality of table of the correction data per transmission frequency and environmental temperature and means for updating storage content of the first storage means with the corresponding table of the second storage means when at least one of the transmission frequency and the environmental temperature is varied.

An address corresponding to the transmission level and a correction data corresponding to the address may be stored in the first storage means. The transmission level may be a sum of an alternating current voltage value corresponding to an instantaneous power of a transmission signal and a direct current voltage corresponding to a part of the power of transmission output signal. The correction data may be consisted of a predetermined amplitude value and a predetermined phase value of the transmission signal. The address corresponding to the transmission level and the correction data corresponding to the address may be stored in the first storage means.

Namely, the distortion compensation circuit for the transmitter assembly according to the present invention having the pre-distortion type linearizer stores the distortion compensation data to be transmitted to the distortion type linearizer in the first memory to sequentially update the data in the first memory with the corresponding table in the second memory depending upon variation of the transmission frequency and the environmental temperature . By this, the transmitter with good transmission waveform can be realized with restricting power consumption without causing increasing of circuit size.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIG. 2 is an illustration showing a correspondence between V=(V1+v2) and a generated address in an address generating portion of FIG. 1;

FIG. 3 is an illustration showing a correspondence between an address and a compensation data in a first memory;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
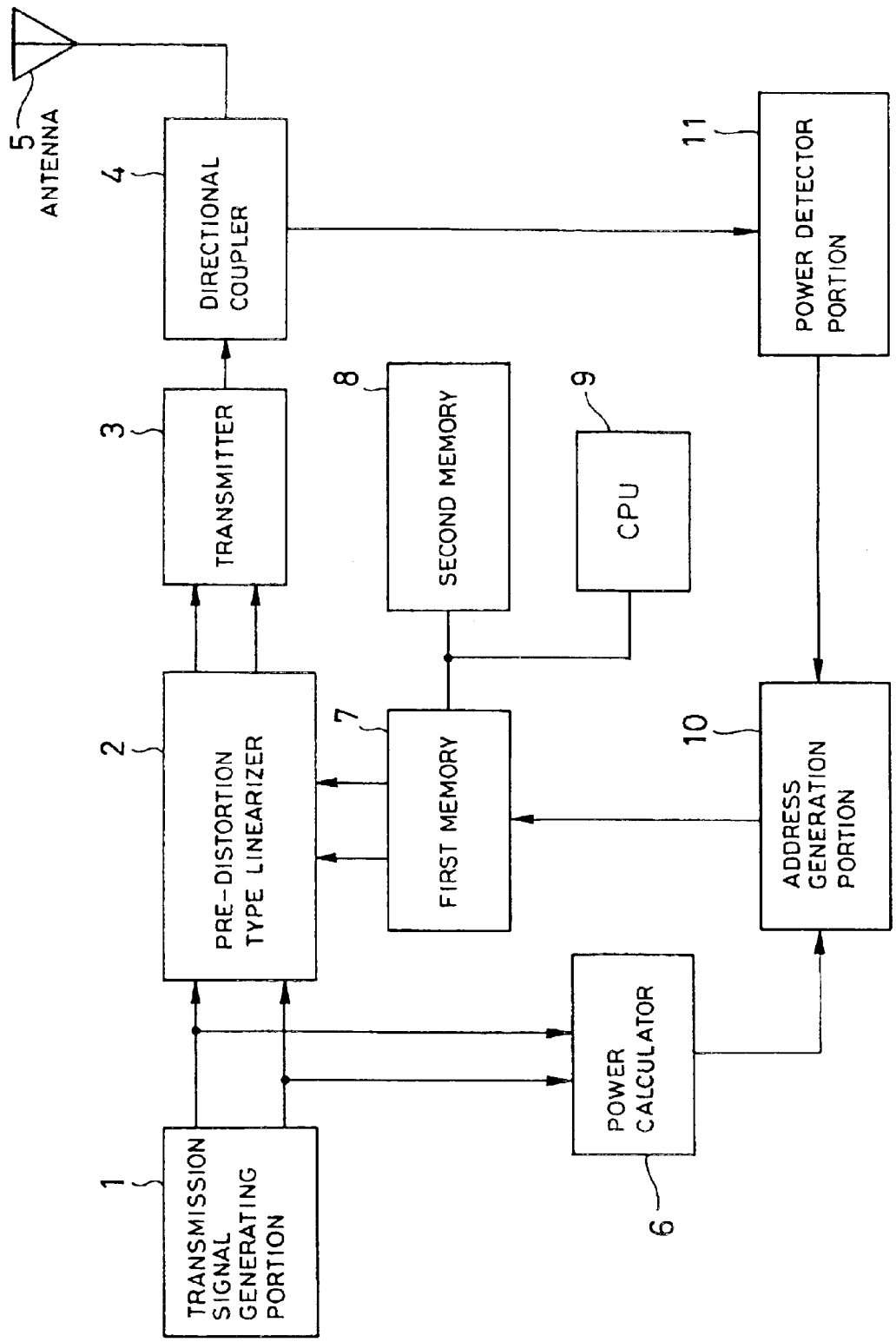
FIG. 1 is a block diagram showing a construction of one embodiment of a transmitter according to the present invention.

FIG. 1 is a block diagram showing a construction of one embodiment of a transmitter according to the present invention. In FIG. 1, one embodiment of a transmitter assembly according to the present invention is constructed with a transmission signal generating portion 1, a pre-distortion type linearizer 2, a transmitter 3, a directional coupler 4, an antenna 5, a power calculator 6, a first memory 7, a second memory 8, a CPU 9, en address generating portion 10 and a power detector portion 11.

The transmission signal generating portion 1 generates a base band signal of an I signal and a Q signal. The transmitter 3 modulates and amplifies the base band signal into an RF signal. Here, the transmission signal may cause distortion due to non-linear characteristics of the amplifier or so forth by the transmitter 3 alone. Therefore, the pre-distortion type linearizer 2 is provided between an output of a the transmission signal generating portion 1 and an input of the transmitter 3.

The pre-distortion type linearizer 2 makes correction for canceling distortion component generated by the transmitter 3 and a correction data component by multiplying a correction data provided from the first memory 7 and the base band signal with each other. By this, an output waveform of the transmitter 3 is improved distortion.

The directional coupler 4 divides the RP signal. Most of the power divided by the directional coupler 4 becomes an output of the antenna, and a part thereof is input to the power detector portion 11. The power detector portion 11 detects the RF signal and outputs a transmission level to the address generating portion 10 as a direct current voltage value V1. The power calculator 6 calculates an instantaneous power of the base band signal to output to the address generating portion 10 as a certain alternating voltage value v2.

The address generating portion 10 determines an address of data to be output by the first memory 7 from the direct current voltage value V1 and the alternating current voltage value v2. The first memory 7 holds a compensation data in a form of a table for outputting the data contained in the designated address to the pre-distortion type linearizer 2.

A compensation data table of the first memory 7 is only established under the same temperature and the same frequency for the transmitter 3. Therefore, it becomes necessary to update the compensation data table depending upon variation of in environmental temperature and a transmission frequency. In the second memory 8, the compensation data tables are stored for all cases with taking the transmission frequency and the environmental temperature. CPU 9 transfers the compensation data table from the second memory 8 to the first memory 7 depending upon variation of the environmental temperature and the transmission frequency.

FIG. 2 is an illustration showing a correspondence between V=(V1+v2) and the generated address in the address generating portion 10 of FIG. 1. In FIG. 2, there is illustrated the compensation data table storing addresses with correspondence to the level of (V1+v2).

In the shown compensation table, "0" is stored as an address to be output when the level of (V1+v2) is a "<A0", "1" is stored as an address to be output when the level of (V1+v2) is "A0 ≦V<A1", "2" is stored as an address to be output when the level of (V1+v2) is "A1≦V<A2", and "3" is stored as an address to be output when the level of (V1+v2) is "A2 ≦V<A3", . . . , respectively.

FIG. 3 is an illustration showing a correspondence between the address and the compensation data in the first memory 7 of FIG. 1. In FIG. 3, there is shown an example, in which the compensation data table #1 storing the address and the compensation data with correspondence is stored in the first memory 7.

In the compensation data table #1, a compensation data "~$\Delta$G10, ~$\Delta\theta$10" is stored in an address "0", a compensation data "~$\Delta$G11, ~$\Delta\theta$11" is stored in an address "1", a compensation data "~$\Delta$G12, ~$\Delta\theta$12" is stored in an address "2", a compensation data "~$\Delta$G13, ~$\Delta\theta$13" is stored in an address "3", . . . , respectively.

Figures 4, 5:
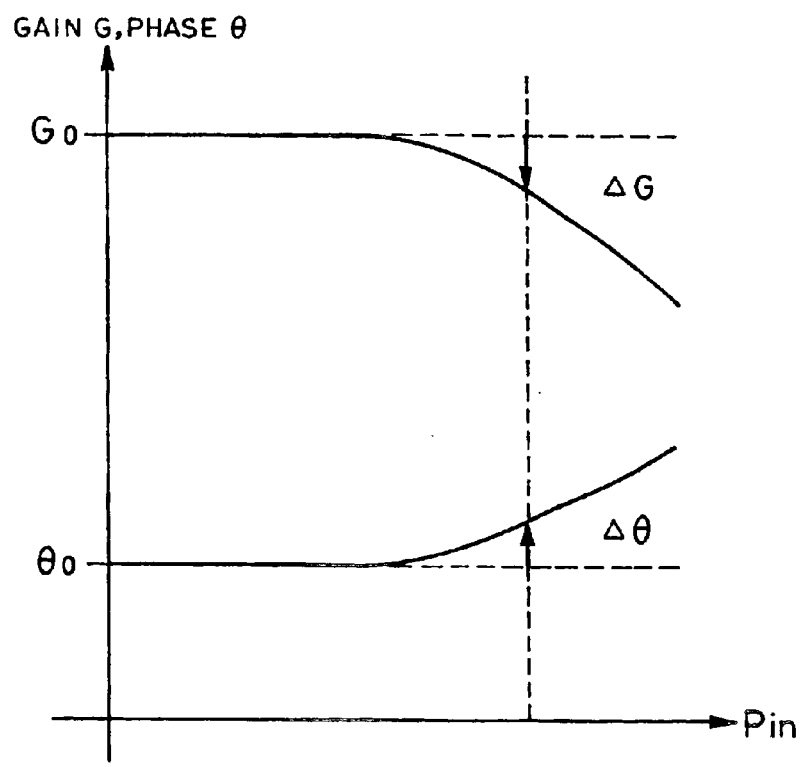
FIG. 4 is an illustration showing a correspondence between a temperature and a frequency and a compensation table in a second memory of FIG. 1.
FIG. 5 is an illustration showing a gain and a phase characteristics of the transmitter alone of FIG. 1.

FIG. 4 is an illustration showing a correspondence between the temperature and frequency and the compensation data table in the second memory 8 of FIG. 1. In FIG. 4, there is shown an example, in which the compensation data tables "table #0", "table #1", "table #2", "table 3" are respectively stored with correspondence with a temperature t (<t0, t0 ≦t<t1, t1≦t<t2, t2≦t<t3 . . . ) and a frequency f (f0, f1, f2, . . . ).

Figure 6:
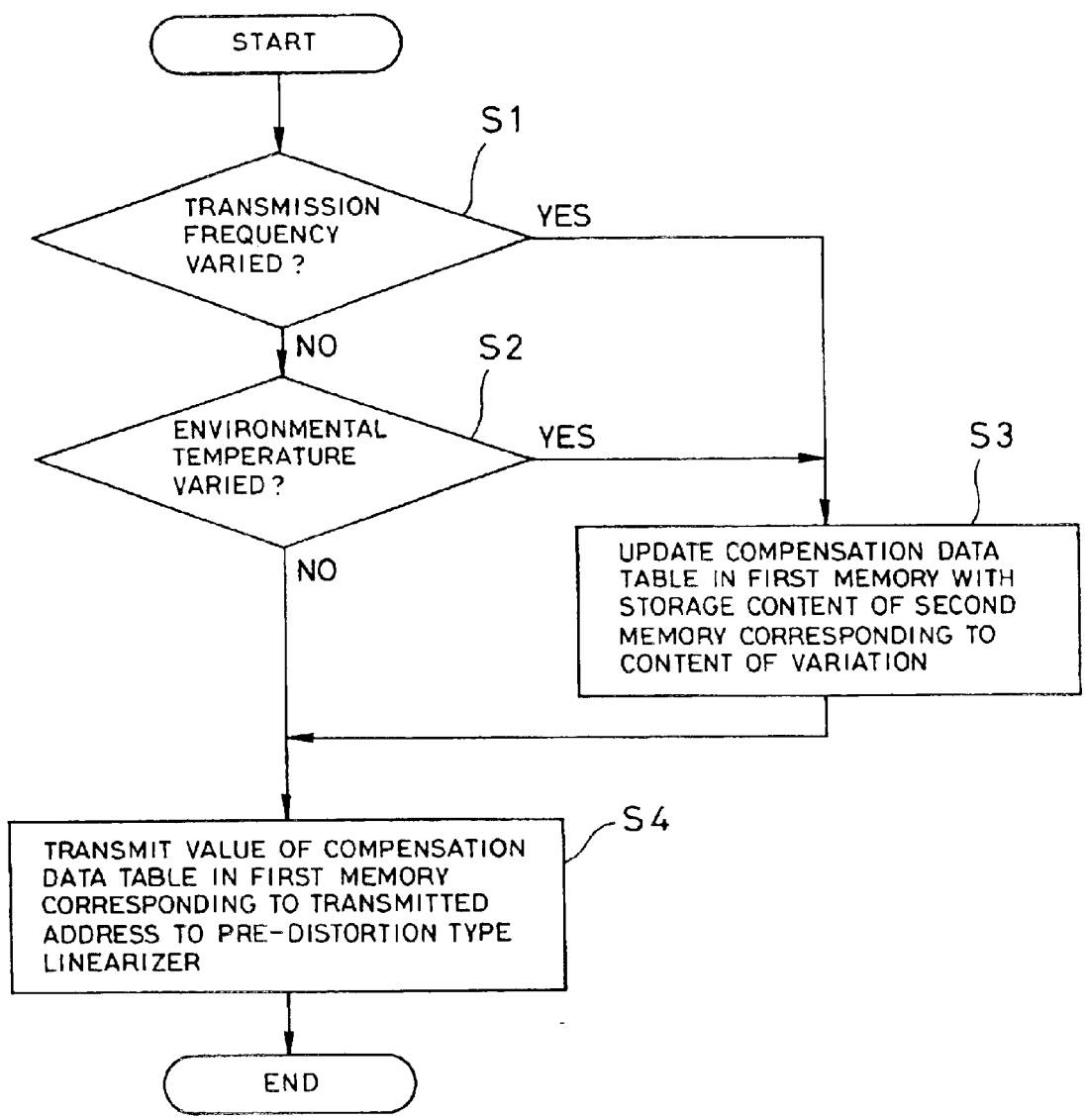
FIG. 6 is a flowchart showing a process operation of CPU of FIG. 1.
Figure 7:
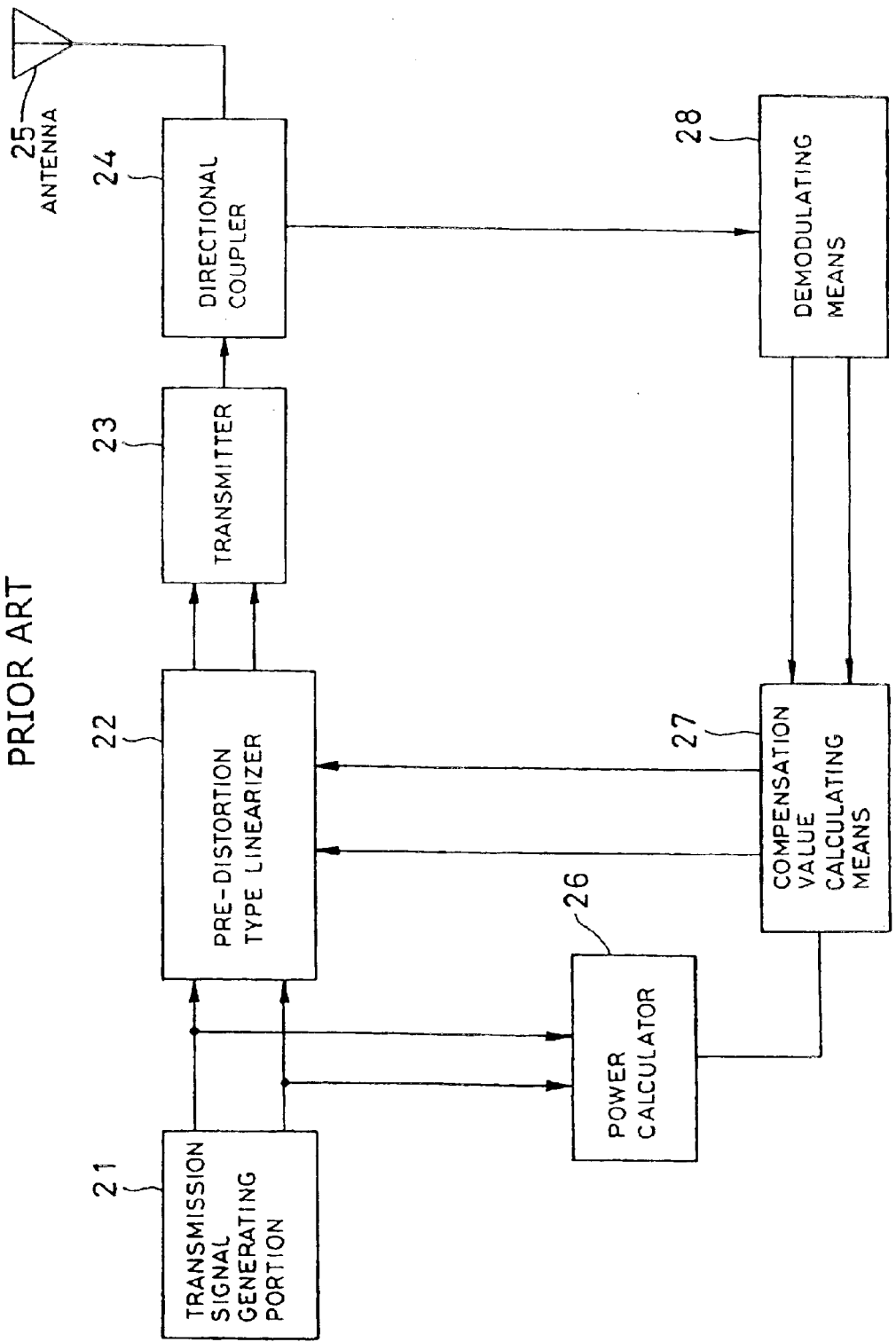
FIG. 7 is a block diagram showing a construction of the conventional transmitter.

FIG. 5 is an illustration showing a gain and a phase characteristics of the transmitter 3 alone of FIG. 1. FIG. 6 is a flowchart showing a process operation of CPU 9 of FIG. 1. Referring to FIGS. 1 to 6, discussion will be given for operation of one embodiment of a distortion compensation circuit of the transmitter according to the present invention.

For example, considering the case that the transmission frequency is fo and the temperature is t1 to t2, a content of the compensation data table #2 corresponding to this condition is stored in the first memory 7. The base band signal generated by the transmission signal generating portion 1 is modulated into the RF signal and amplified by the transmitter 3 via the pre-distortion type linearizer 2.

It is assumed that distortion of $\Delta$G in amplitude of the transmission signal and $\Delta\theta$ in phase is caused in comparison with the ideal case where no internal distortion is present in the transmitter 3 (see FIG. 5). The Rp signal output by the transmitter 3 is divided by the directional coupler 4 to input a part of the divided power to the power detector portion 11.

The power detector portion 11 detects this signal to output the result of detection to an address generating portion 10 as the direct current voltage value V1. The address generating portion 10 combines the direct current voltage value V1 and an instantaneous power value v2 derived by the power calculator 6 to determine an address of the data to be output by the first memory 7 from V1+v2. In FIG. 2, assuming, for example, A1≦V1+v2<A2, the address becomes "2". Therefore, in FIG. 3, the first memory 7 outputs data (~$\Delta$G12, ~$\Delta\theta$12) of the address "2" to the pre-distortion type linearizer 2.

Here, it is assumed that the temperature is varied from t2 to t3. In FIG. 4, CPU 9 transfers the content of the compensation data table #3 corresponding to this condition from the second memory B to the first memory 7 to update the data content of the first memory 7. For example, data of the address "2" of the first memory 7 becomes (~ΔG22, ~Δθ22) taking the temperature characteristics of the transmitter 3 into account.

Namely, when the transmission frequency is varied (step S1 of FIG. 6) or when the environmental temperature is varied (step S2 of FIG. 6), CPU 9 updates storage content of the first memory 7 corresponding to variation content of the compensation data table in the second memory 8 (step S3 of FIG. 6).

Once updating of CPU 9 is completed, CPU 9 effects control for transmitting a value of the compensation data table in the first memory 7 corresponding to the address transmitted to the first memory 7 from the address generating portion 10 to the pre-distortion type linearizer 2 (step S4 of FIG. 6).

When the transmission frequency or the environmental temperature does not vary, CPU 9 effects control for transmitting a value of the compensation data table in the first memory 7 before updating corresponding to the address transmitted to the first memory 7 from the address generating portion 10 to the pre-distortion type linearizer 2 (step S4 of FIG. 6).

As set forth above, by storing the distortion correction data to be transmitted to the pre-distortion type linearizer in the first memory 7 and sequentially updating data in the first memory 7 with the storage content of the second memory 8 depending upon variation of the transmission frequency and the environmental temperature, the transmitter assembly with good transmission waveform can be realized without causing increasing of circuit size and power consumption.

As set forth above, according to the present invention, in the transmitter assembly including the pre-distortion type linearizer which effects correction for mutually canceling the distortion component caused in the transmission signal and the correction data component, by inputting the value corresponding to the transmission level from the first memory means preliminarily storing the correction data to the pre-distortion type linearizer, current consumption can be restricted without causing increasing of circuit scale.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A transmitter assembly comprising:
    a pre-distortion type linearizer to cancel a distortion component caused in a transmission signal and a correction data component; and
    first storage means for preliminarily storing said correction data component;
    wherein said first storage means manages said correction data component as a table per transmission level and
    wherein said transmission level is a sum of an alternating current voltage value corresponding to an instantaneous power of the transmission signal and a direct current voltage value corresponding to a part of the power of a transmission output signal of the transmitter assembly.

2. The transmitter assembly as set forth in claim 1, which further comprises:
    second storage means having a plurality of tables of said correction data component per transmission frequency and environmental temperature; and
    means for updating the content of said first storage means with the corresponding table of said second storage means when at least one of the transmission frequency and the environmental temperature is varied.

3. The transmitter assembly as set forth in claim 1, wherein an address corresponding to said transmission level and said instantaneous power, and said correction data component corresponding to said address are stored in said first storage means.

4. The transmitter assembly as set forth in claim 1, wherein said correction data component consists of a predetermined amplitude value and a predetermined phase value of the transmission signal.

5. A distortion compensation method for a transmitter, comprising:
    reading out a value corresponding to a transmission level from a first storage means preliminarily storing a correction data component; and
    inputting the read out value to a pre-distortion type linearizer;
    wherein said first storage means manages said correction data component in a form of a table per transmission level; and
    wherein said transmission level is a sum of an alternating current voltage value corresponding to an instantaneous power of a transmission signal and a direct current voltage corresponding to a part of the power of transmission output signal.

6. The distortion compensation method as set forth in claim 5, wherein a storage content of said first storage means is updated with a corresponding table in said second storage means storing a plurality of tables storing said correction data component per transmission frequency and environmental temperature when at least one of said transmission frequency and environmental temperature is varied.

7. The distortion compensation method as set forth in claim 5, wherein an address corresponding to the transmission level and the instantaneous power, and the correction data component corresponding to said address are stored in said first storage means.

8. The distortion compensation method as set forth in claim 5, wherein said correction data component consists of a predetermined amplitude value and a predetermined phase value of the transmission signal.

9. A transmitter assembly comprising:
    a pre-distortion type linearizer to cancel a distortion component caused in a transmission signal and a correction data component;
    transmission signal generating means generating a baseband signal of an I signal and a Q signal;
    transmission means modulating and amplifying said baseband signal into an RF signal;
    said pre-distortion type linearizer being provided between an output of said transmission signal generating means and an input of said transmission means;
    directional coupling means dividing said RF signal;
    power detecting means detecting said RF signal and outputting a transmission level to address generating means;
    power calculating means calculating an instantaneous power of said baseband signal to output to said address generating means;

said address generating means detecting an address of data to be output by a first storage means from said transmission level and said instantaneous power of said baseband signal; and said first storage means for preliminarily storing said correction data component.

10. The transmitter assembly as set forth in claim 9, wherein said first storage means manages correction data as a table per said transmission level.

11. The transmitter assembly as set forth in claim 10, wherein the address corresponding to said transmission level and said instantaneous power, and a correction data component corresponding to said address are stored in said first storage means.

12. The transmitter assembly as set forth in claim 10, wherein said transmission level is a sum of an alternating current voltage value corresponding to the instantaneous power of the transmission signal and a direct current voltage value corresponding to a part of the power of a transmission output signal.

13. The transmitter assembly as set forth in claim 9, which further comprises:

second storage means having a plurality of tables of said correction data component per transmission frequency and environmental temperature; and means for updating the content of said first storage means with the corresponding table of said second storage means when at least one of the transmission frequency and the environmental temperature is varied.

14. The transmitter assembly as set forth in claim 9, wherein said correction data component consists of a predetermined amplitude value and a predetermined phase value of the transmission signal.

15. A distortion compensation method for a transmitter, comprising:

providing a pre-distortion type linearizer between an output of a transmission signal generating means and an input of a transmission means;

dividing an RF signal by a directional coupling means;

detecting said RF signal and outputting a transmission level to address generating means by power detecting means;

calculating an instantaneous power of a baseband signal to output to said address generating means by power calculating means;

determining an address of data to be output by a first storage means from said transmission level and said instantaneous power of said baseband signal by said address generating means reading out a value corresponding to said transmission level from said first storage means preliminarily storing a correction data component; and inputting the read out value of the correction data component to said pre-distortion type linearizer.

16. The distortion compensation method as set forth in claim 15, wherein said first storage means manages the correction data component in a form of a table per said transmission level.

17. The distortion compensation method as set forth in claim 16, wherein the address corresponding to the transmission level and the instantaneous power, and the correction data component corresponding to said address are stored in said first storage means.

18. The distortion compensation method as set forth in claim 16, wherein said transmission level is a sum of an alternating current voltage value corresponding to the instantaneous power of said transmission signal and a direct current voltage value corresponding to a part of the power of a transmission output signal.

19. The distortion compensation method as set forth in claim 15, wherein a storage content of said first storage means is updated with a corresponding table in a second storage means storing a plurality of tables storing said correction data component per transmission frequency and environmental temperature when at least one of said transmission frequency and environmental temperature is varied.

20. The distortion compensation method as set forth in claim 15, wherein said correction data component consists of a predetermined amplitude value and a predetermined phase value of the transmission signal.

* * * * *

UNITED STATES PATENT AND TRADEMARK OFFICE
CERTIFICATE OF CORRECTION

PATENT NO. : 6,909,756 B1 Page 1 of 1
APPLICATION NO. : 09/686760
DATED : June 21, 2005
INVENTOR(S) : Nakajima It is certified that error appears in the above-identified patent and that said Letters Patent is hereby corrected as shown below:

Column 4, line 29, before "3" insert -- # --

Signed and Sealed this

Thirtieth Day of September, 2008

JON W. DUDAS
*Director of the United States Patent and Trademark Office*